United States Patent
Chuang et al.

(10) Patent No.: US 8,647,988 B2
(45) Date of Patent: Feb. 11, 2014

(54) MEMORY DEVICE AND METHOD OF FABRICATING THE SAME

(71) Applicant: Nanya Technology Corporation, Tao-Yuan Hsien (TW)

(72) Inventors: Ying Cheng Chuang, Taoyuan County (TW); Ping Cheng Hsu, Taipei (TW); Sheng Wei Yang, Taoyuan County (TW); Ming Cheng Chang, Taipei County (TW); Hung Ming Tsai, Kaohsiung (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 0 days.

(21) Appl. No.: 13/784,346

(22) Filed: Mar. 4, 2013

(65) Prior Publication Data

US 2013/0183808 A1    Jul. 18, 2013

Related U.S. Application Data

(62) Division of application No. 12/945,423, filed on Nov. 12, 2010, now Pat. No. 8,415,728.

(51) Int. Cl.
*H01L 21/311* (2006.01)

(52) U.S. Cl.
USPC ........... 438/700; 438/311; 438/240; 438/381; 257/E21.007; 257/E21.027; 257/E21.329; 257/E21.267; 257/E21.278; 257/E21.193; 257/E21.304; 257/E21.546; 257/E21.645; 257/E21.646

(58) Field of Classification Search
USPC ......... 438/700, 240, 243, 311, 386, 683, 685; 257/E21.007, E21.027, E21.229, 257/E21.267, E21.278, E21.193, E21.304, 257/E21.546, E21.645, E21.646
See application file for complete search history.

(56) References Cited

U.S. PATENT DOCUMENTS

| | | | |
|---|---|---|---|
| 4,612,629 A | 9/1986 | Harari | |
| 6,661,702 B1 | 12/2003 | Walker | |
| 7,636,256 B2 | 12/2009 | Gomikawa et al. | |
| 8,415,728 B2 * | 4/2013 | Chuang et al. | 257/296 |
| 2005/0063233 A1 | 3/2005 | Brown | |
| 2009/0003070 A1 | 1/2009 | Gomikawa et al. | |
| 2009/0267233 A1 | 10/2009 | Lee | |
| 2010/0112753 A1 | 5/2010 | Lee | |

FOREIGN PATENT DOCUMENTS

| | | |
|---|---|---|
| CN | 1841710 | 10/2006 |
| CN | 101170113 | 4/2008 |

OTHER PUBLICATIONS

Office action issued on Mar. 19, 2013 for the corresponding China Patent Application No. 201110168485.1.
English translation of Office action issued on Mar. 19, 2013 for the corresponding China Patent Application No. 201110168485.1 and cited foreign references of CN1841710A and CN101170113A.
Office Action dated Sep. 30, 2013 from Taiwan counterpart application 100108227.
English translation Office Action dated Sep. 30, 2013 from Taiwan counterpart application 100108227.

* cited by examiner

*Primary Examiner* — David Nhu
(74) *Attorney, Agent, or Firm* — WPAT, P.C.; Anthony King

(57) ABSTRACT

A memory device includes a mesa structure and a word line. The mesa structure, having two opposite side surfaces, includes at least one pair of source/drain regions and at least one channel base region corresponding to the pair of source/drain regions formed therein. The word line includes two linear sections and at least one interconnecting portion. Each linear section extends on the respective side surface of the mesa structure, adjacent to the channel base region. The at least one interconnecting portion penetrates through the mesa structure, connecting the two linear sections.

7 Claims, 19 Drawing Sheets

MEMORY DEVICE AND METHOD OF FABRICATING THE SAME

This is a divisional application of U.S. application Ser. No. 12/945,423, filed on Nov. 12, 2010, U.S. Pat. No. 8,415,728, the entirety of which is herein incorporated by reference.

DESCRIPTION

1. Technical Field

The present invention relates to a memory device, and more particularly relates to a memory device with a trench cell structure and a method of fabricating the same.

2. Background

Due to their structural simplicity, DRAMs (dynamic random access memories) can provide more memory per unit chip area than other types of memories such as static random access memories. A DRAM is comprised of a plurality of DRAM cells, each of which includes a capacitor for storing information and a transistor coupled to the capacitor for regulating when the capacitor is charged or discharged. During a read operation, a word line is asserted, turning on the transistor. The enabled transistor allows the voltage across the capacitor to be read by a sense amplifier through a bit line. During a write operation, the data to be written is provided on the bit line while the word line is asserted.

To satisfy the demand for greater memory storage, there is a need for DRAM memory cells of reduced size. DRAM memory cell size can be reduced in several ways. One way is to reduce the minimum feature size of a DRAM memory cell through the advances in process technology. Another way to reduce the size of a DRAM memory cell is by designing a memory cell having a smaller feature size. For example, many DRAM chips on the market today have a memory cell size of $6F^2$, where F stands for the photolithographic minimum feature width.

However, the decrease of the size of memory cells results in some issues. The disturbance between memory cells or between word lines may easily occur and the resistance of the word line increases due to the decrease of its cross-sectional area.

One conventional DRAM device includes an array having a plurality of access transistors. A word line functioning as a gate extends from one side of the array to an opposite side of the array such that each transistor can operate as a double gate transistor. Due to the resistance of the word line, the voltage supplied to the word line drops along the word line. Consequently, two corresponding locations on the opposite sides of the array have significant voltage drop, resulting in problematic operation of the corresponding access transistor.

SUMMARY

In view of the above problems, the present invention provides an embodied memory device comprising a mesa structure and a word line. The mesa structure, having two opposite side surfaces, includes at least one pair of source/drain regions and at least one channel base region corresponding to the pair of source/drain regions formed therein. The word line includes two linear sections and at least one interconnecting portion. Each linear section extends on the respective side surface of the mesa structure, adjacent to the channel base region. The at least one interconnecting portion penetrates through the mesa structure, connecting the two linear sections.

The present invention further provides a method of fabricating a memory device comprising the steps of: filling a first dielectric material in a plurality of deep trenches and shallow trenches to separately form a plurality of deep isolations and a plurality of shallow isolations, wherein each shallow trench is formed between two adjacent ones of the plurality of the deep trenches; forming a plurality of depressions transverse to the deep isolations, wherein two adjacent ones of the plurality of depressions define a mesa structure, and the depression is wider than the mesa structure; filling the plurality of depressions with a second dielectric material; removing a portion of the first dielectric material from the shallow trenches and the deep trenches and a portion of the second dielectric material from the depressions; forming a conductive layer in the shallow trenches, the deep trenches and the depressions; and removing a portion of the conductive layer in the depression to form two word lines The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 1:
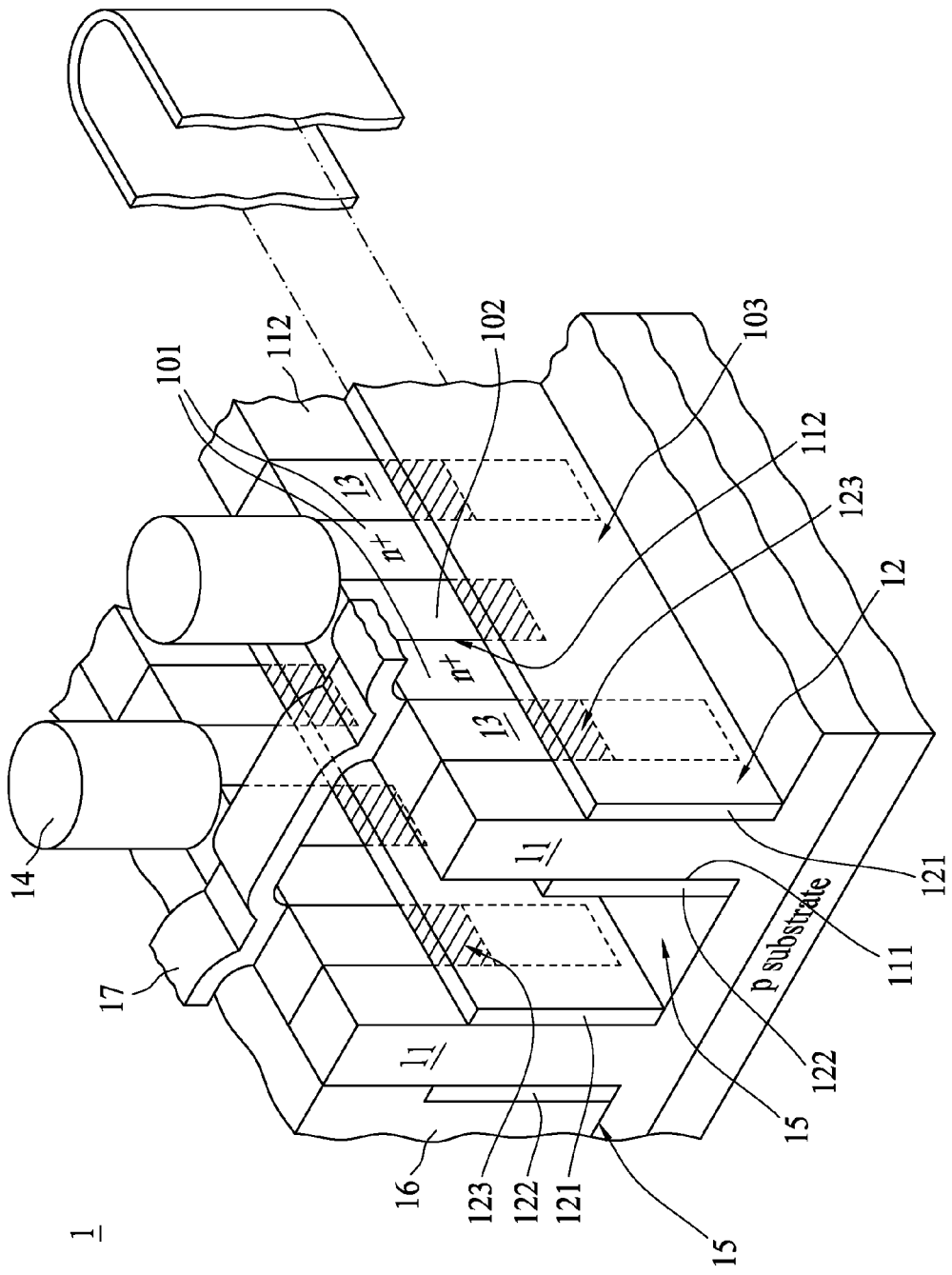
FIG. 1 is a perspective view of a memory device according to one embodiment of the present invention.

FIG. 1 is a perspective view of a memory device 1 according to one embodiment of the present invention. Referring to FIG. 1, the memory device 1 comprises a mesa structure 11 in which at least one pair of source/drain regions 101, at least one isolation pillar 102 corresponding to the at least one pair of source/drain regions 101 and at least one channel base region 103 corresponding to the at least one pair of source/drain regions 101 are formed. Each pair of source/drain regions 101 partially defines a top of the mesa structure 11, are separated by the at least one isolation pillar 102, and are connected by the at least one channel base region 103 at their bottoms to provide channel current flow. In addition, the isolation pillar 102 can be made of any suitable dielectric material such as silicon oxide.

A word line 12 is configured to extend from one side to an opposite side of the mesa structure 11 as shown in FIG. 1, around an end portion of the mesa structure 11, and has two linear sections 121 and 122, separately extending on two opposite side surfaces 111 of the mesa structure 11, separated from the mesa structure 11 by oxide layers, and disposed adjacent to the channel base region 103 for forming gates so as to address the channel base region 103. The word line 12 can be formed of, for example, titanium nitride or any suitable conductive material. In addition, the word line 12 may include at least one interconnecting portion 123 penetrating through the mesa structure 11, connecting the two linear sections 121 and 122 so as to minimize the voltage difference between the two linear sections 121 and 122 on the opposite sides of the mesa structure 11.

The at least one interconnecting portion 123 is isolated from the at least one pair of source/drain regions 101 and the at least one channel base region 103 by, for example, silicon dioxide. The at least one interconnecting portion 123 can penetrate at any suitable location. In one embodiment, the at least one interconnecting portion 123 penetrates through one isolation pillar 102. Further, each isolation pillar 102 can be formed within a trough 112 formed in the mesa structure 11, and, in one embodiment, the at least one interconnecting portion 123 can be adjacent the bottom of the trough 112.

A plurality of isolation structures 13 can be formed in the mesa structure 11. Each pair of source/drain regions 101 and their corresponding channel base region 103 are defined by two corresponding adjacent isolation structures 13. The isolation structures 13 can also be formed using any suitable dielectric material such as silicon oxide. In one embodiment, the at least one interconnecting portion 123 can penetrate through the isolation structure 13.

As shown in FIG. 1, each word line 12 includes a plurality of interconnecting portions 123. These interconnecting portions 123 are arranged along the extension direction of the word line, penetrating the mesa structure 11 to connect the linear sections 121 and 122. In one embodiment, the interconnecting portions 123 correspondingly penetrate through the isolation structures 13 and the isolation pillars 102.

As illustrate in FIG. 1, one of the pair of source/drain regions 101 of the transistor of one embodiment of the present invention can connect a capacitor 14, and another of the pair of source/drain regions 101 can connect a corresponding bit line 17 for performing reading or writing operations. A finished memory cell in one embodiment of the present invention can have an area of approximately $4F^2$ or less, where F is the minimum lithographic feature size.

The transistor of one embodiment of the present invention can be an n-channel device, which is built on a layer of a second conductivity type (n−) on a substrate of a first conductivity type (p) and has source/drain regions 101 of a second conductivity type (n+) and a channel base region 103 of a first conductivity type (p−). If a p-channel device is desired, the doping types and levels of the elements of the transistor can be adjusted, as is well known in the art.

Adjacent mesa structures 11 are separated by a depression 15 that can be filled with dielectric material to form an isolation 16, isolating the linear sections 121 and 122 of two word lines 12 from each other in the same depression 15. In the present embodiment, the linear sections 121 and 122 in a depression 15 overlie on the respective side surfaces 111 of the mesa structure 11, separated from each other to the greatest possible extent so that the word lines 12 can be suitably isolated from one another so as to avoid the mutual disturbance. In addition, the word line 12 is oriented vertically such that it can be formed wider to lower its resistance while not being limited by the confined area of the memory cell. In one embodiment, the plurality of mesa structures 11 are arranged in a direction and the length of the mesa structure 11 measured along the direction is approximately one-third the spaced apart distance of two adjacent the mesa structures 11.

Figure 2:
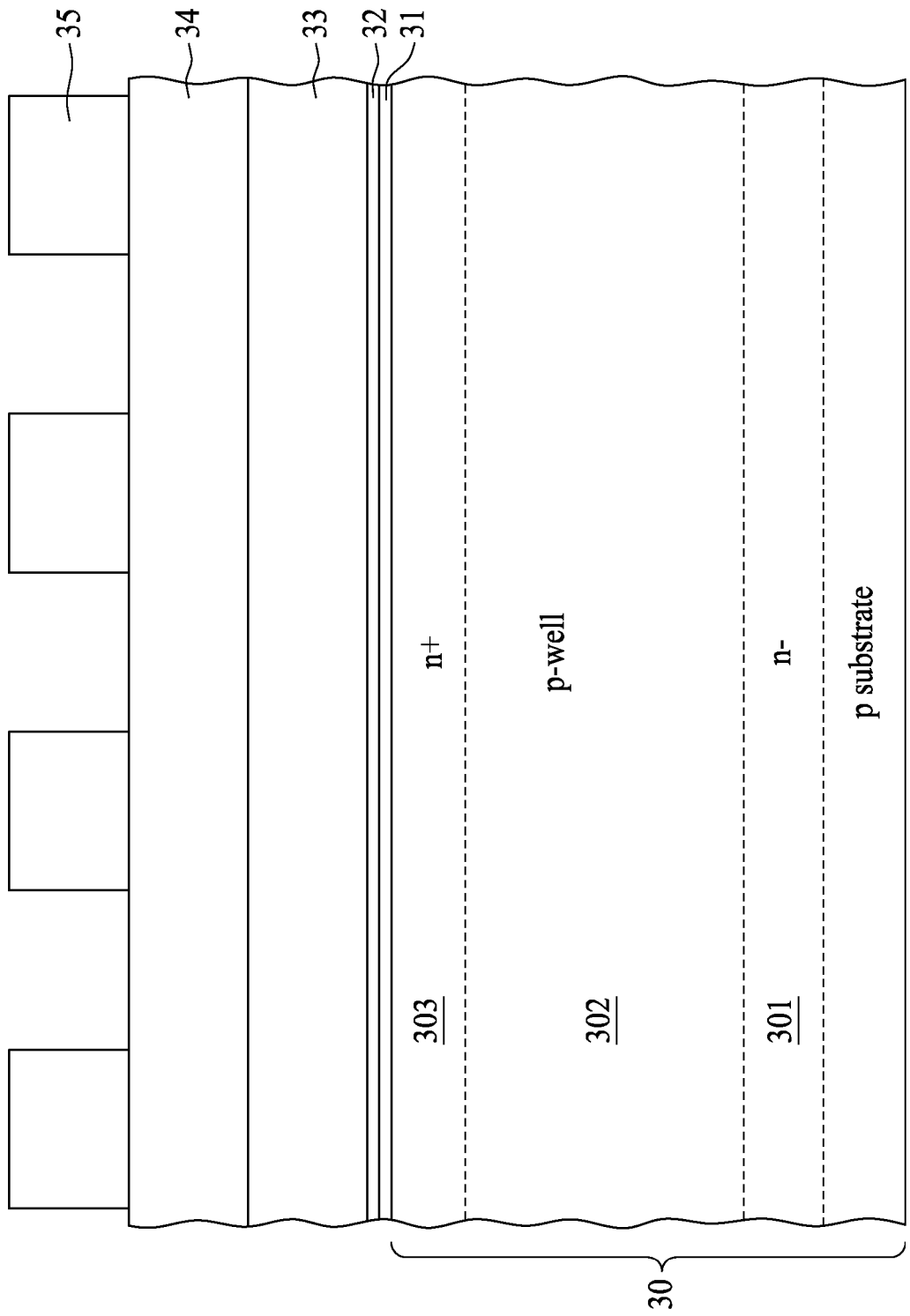
FIGS. 2 through 19 are cross-sectional views showing process steps for essentially forming a memory device according to one embodiment of the present invention.

The memory device 1 is fabricated through processes described as follows, illustrated by FIGS. 2 through 19. Referring to FIG. 2, a substrate 30 is initially processed to include a layer 301 of a second conductivity type (n−), a layer 302 of a first conductivity type (p−) on the layer 301, and a layer 303 of a second conductivity type (n+) on the layer 302.

The substrate 30 is a silicon substrate in the present embodiment, but can alternatively be any other type of substrate for different purposes. The substrate 30 can be undoped or doped, but a p+ type doped wafer is preferred.

An oxide layer 31, a nitride layer 32, a polysilicon layer 33, a tetraethyl orthosilicate (TEOS) layer 34 and a photoresist layer 35 are deposited on the top of the substrate 30 by suitable means such as a chemical deposition process or a spin-on process. The photoresist layer 35 is then patterned to define a line and space pattern by photolithographic techniques. In one embodiment, the line and space pattern includes a plurality of lines spaced apart from each other by a distance, which can be the photolithographic minimum feature width F.

Figure 3:
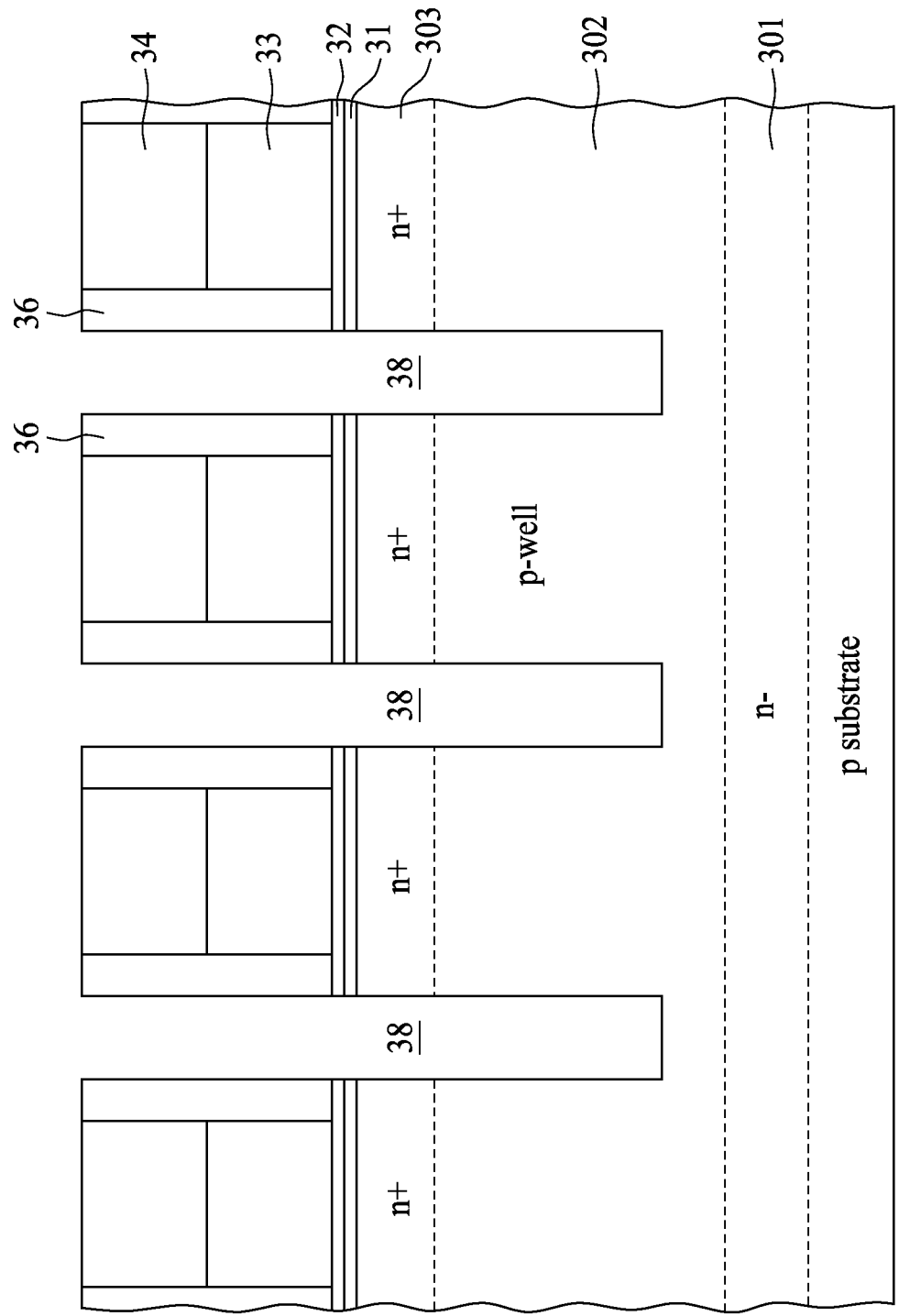

As shown in FIG. 3, the TEOS layer 34 is etched to form a line-and-space pattern therein with the patterned photoresist layer 35 acting as an etching mask. Then, after the photoresist layer 35 is removed, the etched TEOS layer 34 is used as a hard mask to etch the polysilicon layer 33 to form a line-and-space pattern therein. Thereafter, sidewall spacers 36 made of silicon oxide are formed on the sidewalls of the lines of the patterned polysilicon layer 33 and TEOS layer 34. The sidewall spacers 36 are formed to an extent that two sidewall spacers 36 facing each other are spaced by a distance equal to one-half of the photolithographic minimum feature width F. Next, a dry etch process such as plasma etching or reactive ion etching is performed to etch the exposed regions of the substrate 30 between the sidewall spacers 36, through the nitride layer 32 and the oxide layer 31, and into the layer 302 to form a plurality of deep trenches 38 with a width of one-half of the photolithographic minimum feature width F.

Dielectric material is deposited to fill the plurality of deep trenches 38 by a spin-on process or a chemical vapor deposition process. Next, a chemical mechanical polishing (CMP) process is used to remove the TEOS layer 34 and the sidewall spacers 36 above the polysilicon layer 33 so as to form a plurality of deep isolations 40 as shown in FIG. 4.

Figure 4:
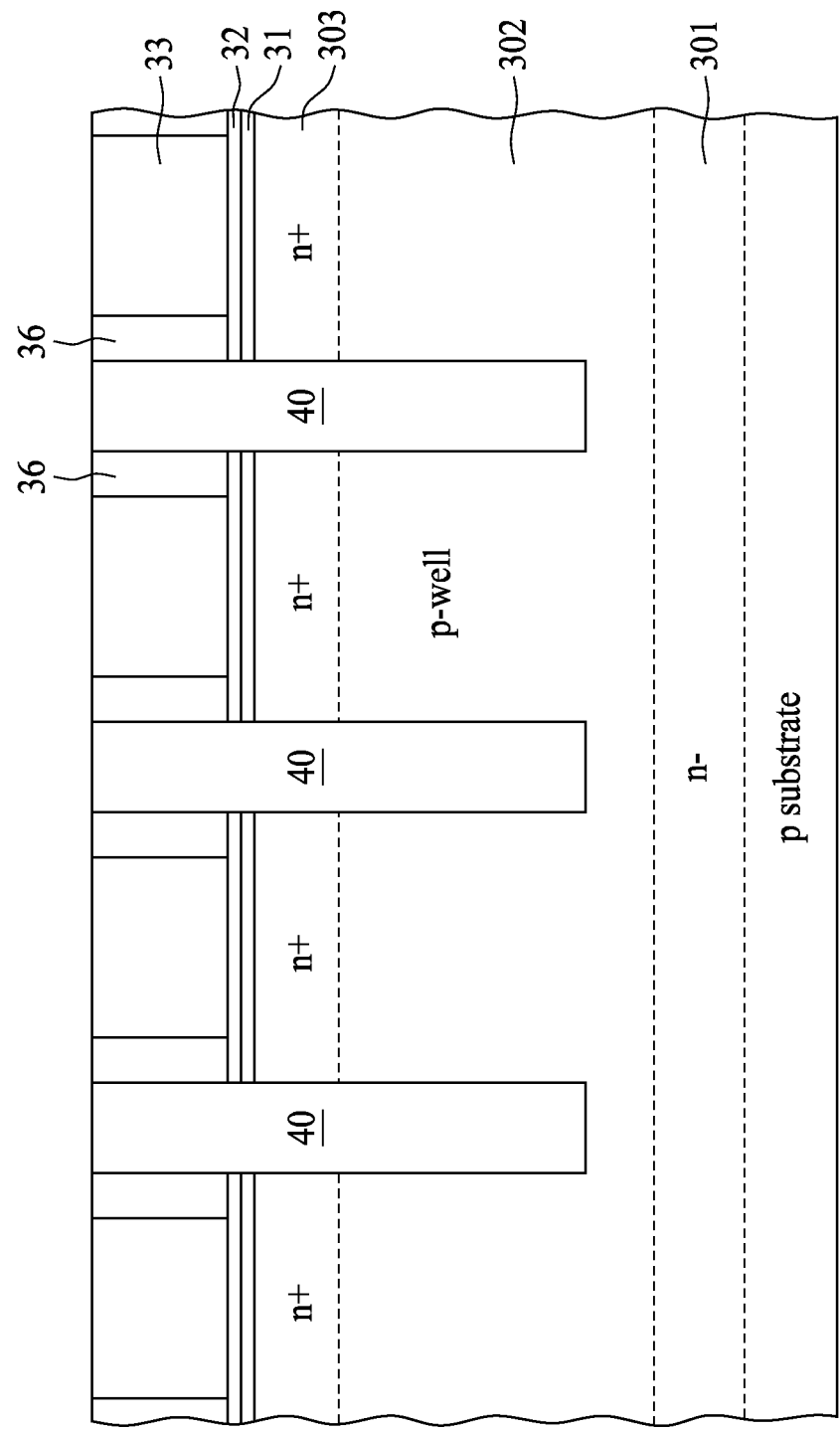
Figure 5:
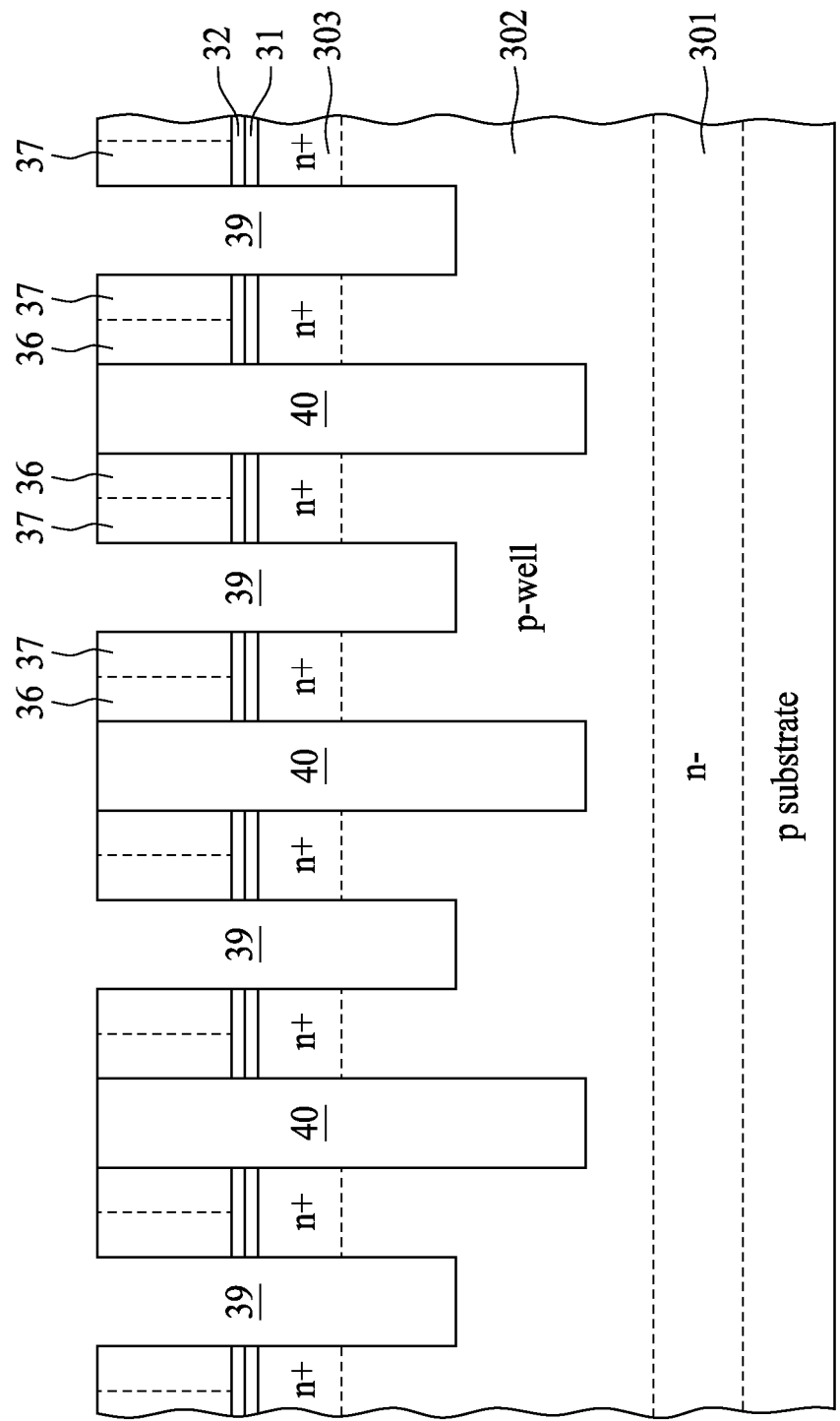

As illustrated in FIGS. 4 and 5, the polysilicon layer 33 is stripped to expose the underlying nitride layer 32 by a suitable stripping technique. Thereafter, sidewall spacers 37 made of silicon oxide are formed on the original sidewall spacers 36, and two sidewall spacers 37 facing each other define a groove having a width of approximately one-half of the photolithographic minimum feature width F. Next, through the grooves, a dry etch process such as plasma etching or reactive ion etching is applied to etch the substrate 30 beneath the grooves, through the nitride layer 32 and the oxide layer 31, and into the layer 302 to form a plurality of shallow trenches 39 with a width of approximately one-half of the photolithographic minimum feature width F as shown in FIG. 5.

Figure 6:
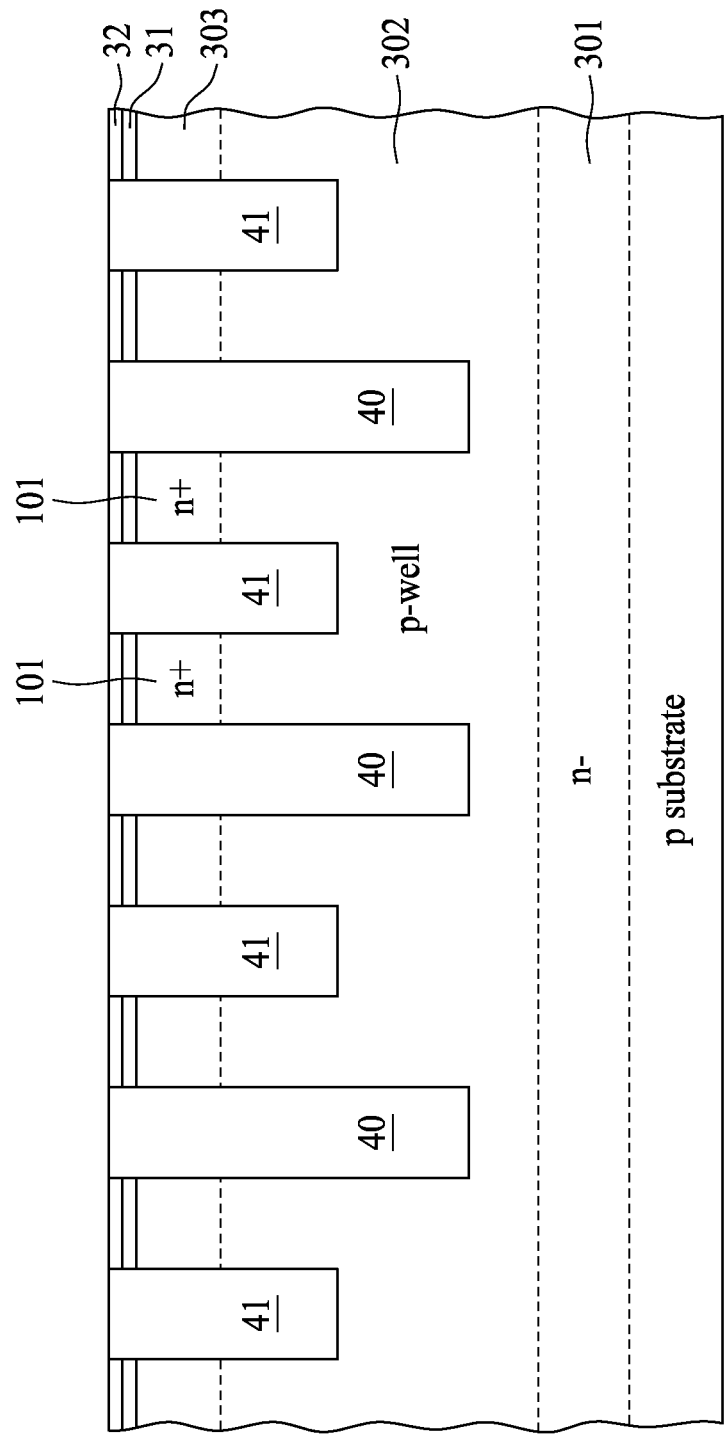

Referring to FIGS. 5 and 6, the shallow trenches 39 are then filled with dielectric material by a deposition process, and a CMP process is then employed to remove the dielectric material above the nitride layer 32 and the silicon oxide sidewall spacers 36 and 37. The CMP process is stopped at the nitride layer 32 and a plurality of shallow isolations 41 are created as shown in FIG. 6. Each shallow isolation 41 creates two separated source/drain regions 101 between two adjacent deep isolations 40 as shown in FIG. 1.

Figure 7:
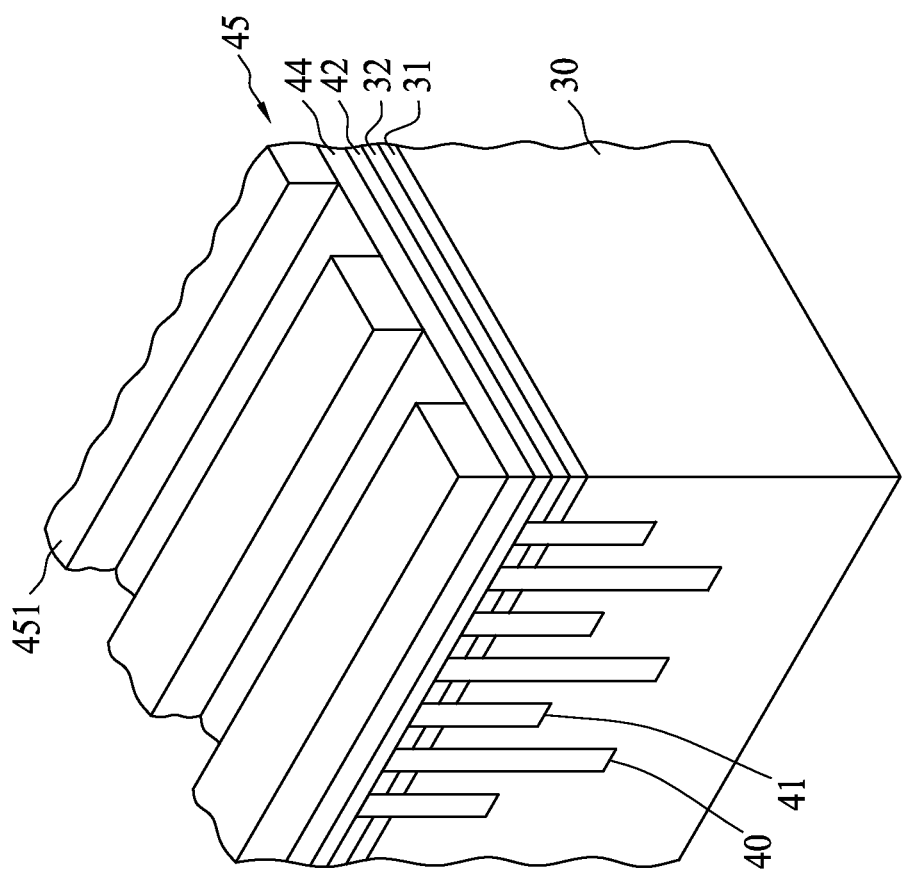
Figure 8:
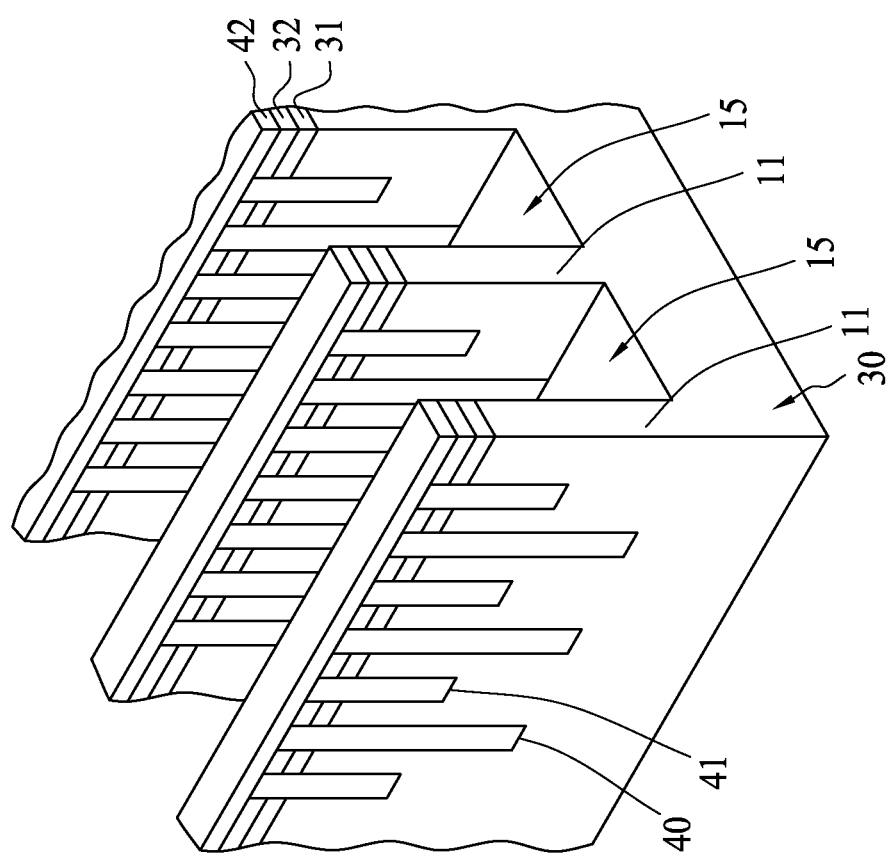

Referring to FIGS. 7 and 8, silicon nitride is deposited to form a silicon nitride layer 42. Next, a hard mask layer 44, and a photoresist layer 45 are sequentially formed by suitable processes. The photoresist layer 45 is then patterned to form a plurality of photoresist lines 451 extending transverse to the extension direction of the deep isolation 40 or shallow isolation 41. In one embodiment, the photoresist line 451 has a width of approximately the photolithographic minimum feature width F, and two adjacent photoresist lines 451 are spaced a distance approximately equal to the photolithographic minimum feature width F.

As shown in FIG. 8, the photoresist lines 451 are trimmed, and the hard mask layer 44 is then etched by a dry etch process using the trimmed photoresist lines 451. Subsequently, an etching process is performed to form a plurality of depressions 15 and a plurality of mesa structures 11 between the depressions 15 by using the etched hard mask layer 44. In one embodiment, the photoresist lines 451 are trimmed in such a manner that the ratio of the width of the depression 15, measured in a direction transverse to the extension direction of the photoresist line 451, to the width of the mesa structure 11 is approximately 3:1. After that, the hard mask layer 44 is stripped. In one embodiment, the hard mask 44 can include a TEOS layer.

Figure 9:
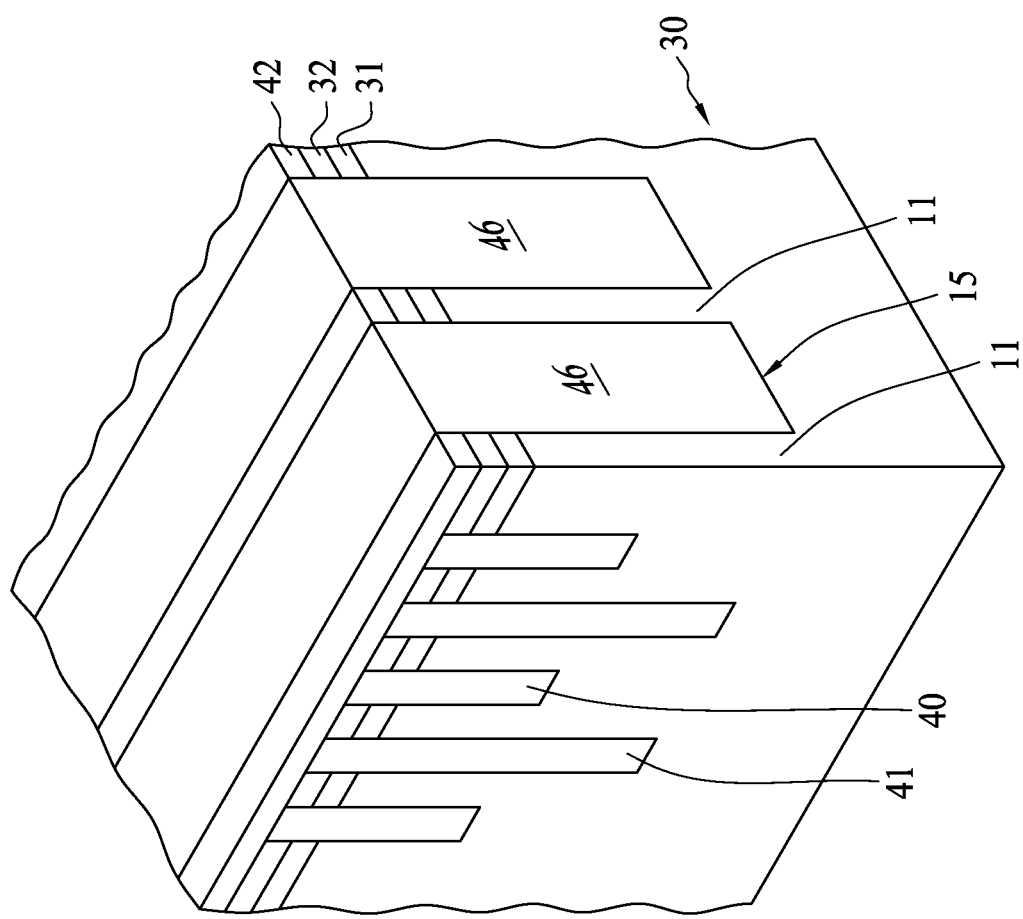

Referring to FIG. 9, dielectric material 46, for example silicon oxide, is deposited to fill the depressions 15, and a CMP process is followed and stopped at the silicon nitride layer 42.

Figure 10:
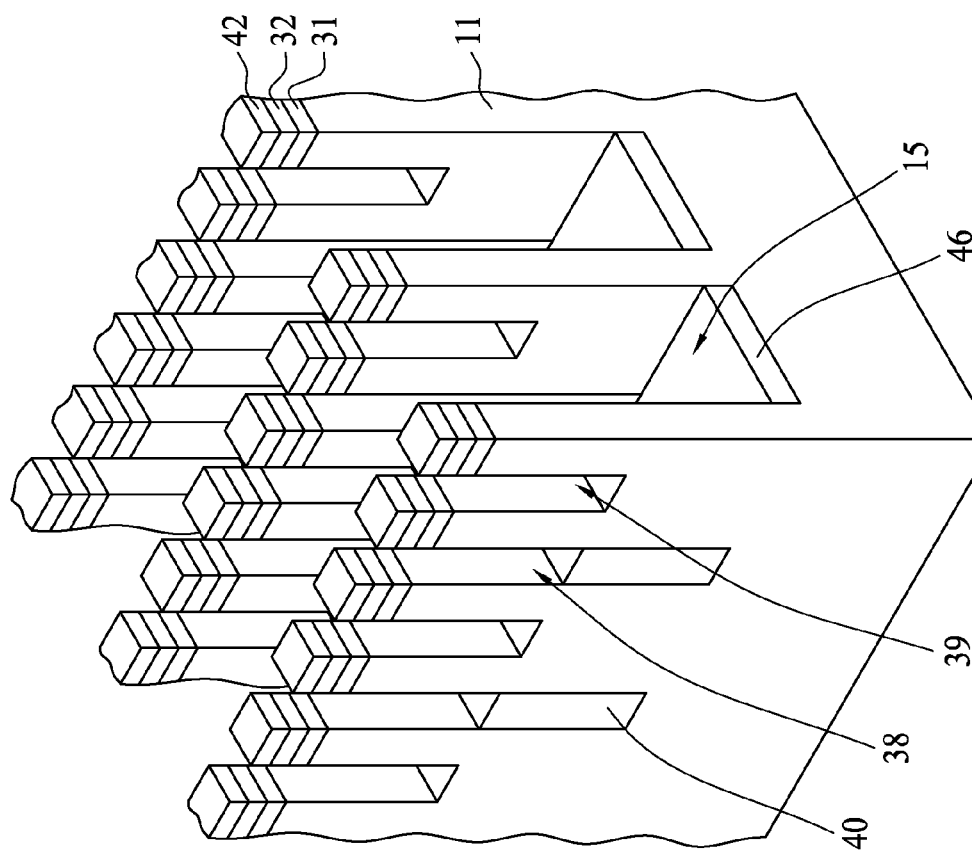

As illustrated in FIG. 10, an etch process, e.g. a dry etch process, is carried out to partially etch back the deposited dielectric material 46 to remove a portion of dielectric material 46 from the deep trenches 38, the shallow trenches 39, and the depressions 15. Due to the existence of the silicon nitride layer 42 on the deep isolations 40 shown in FIG. 8, the dielectric material 46 in the deep trenches 38 is not etched as deep as that in depressions 15. After the etch back process is performed, the dielectric material layer 46 may be left in the depressions 15.

Figure 11:
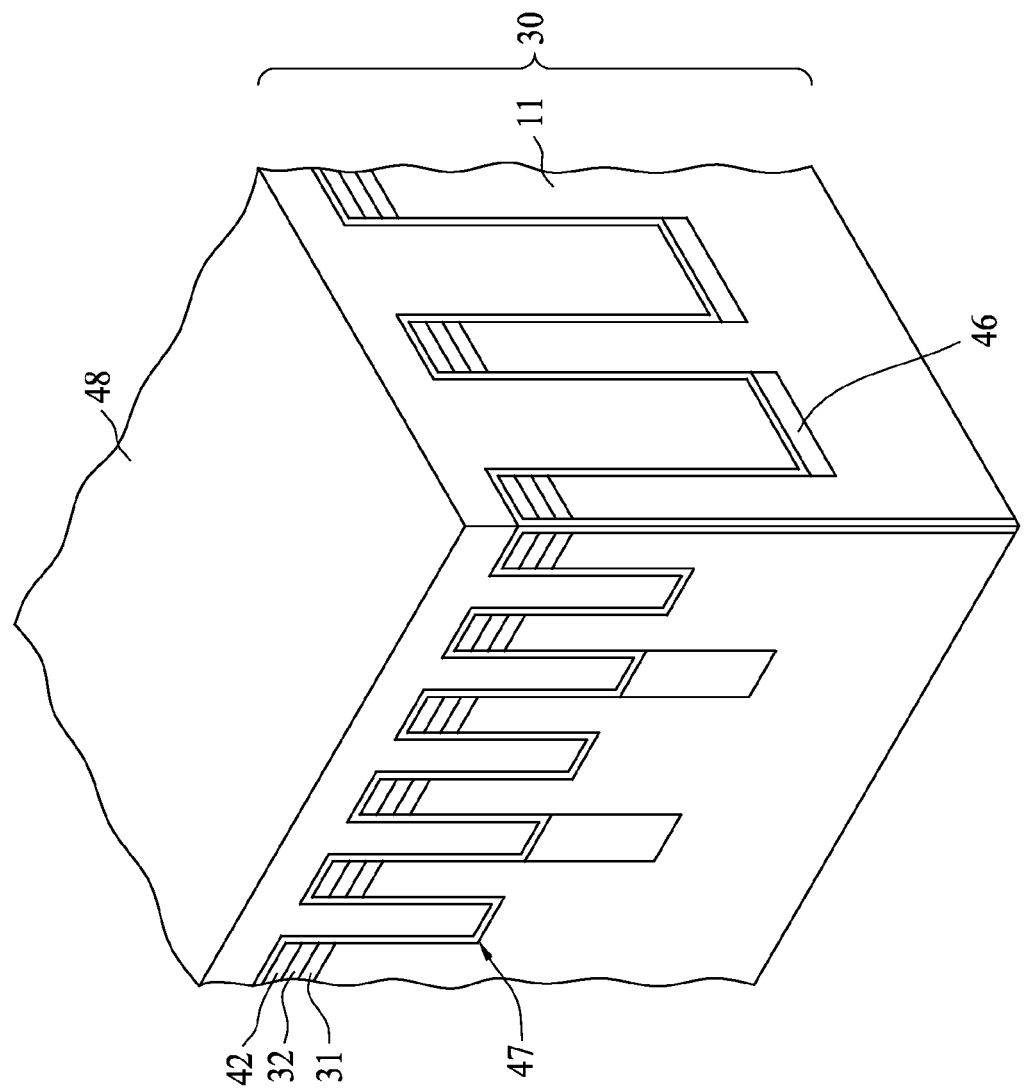
Figure 12:
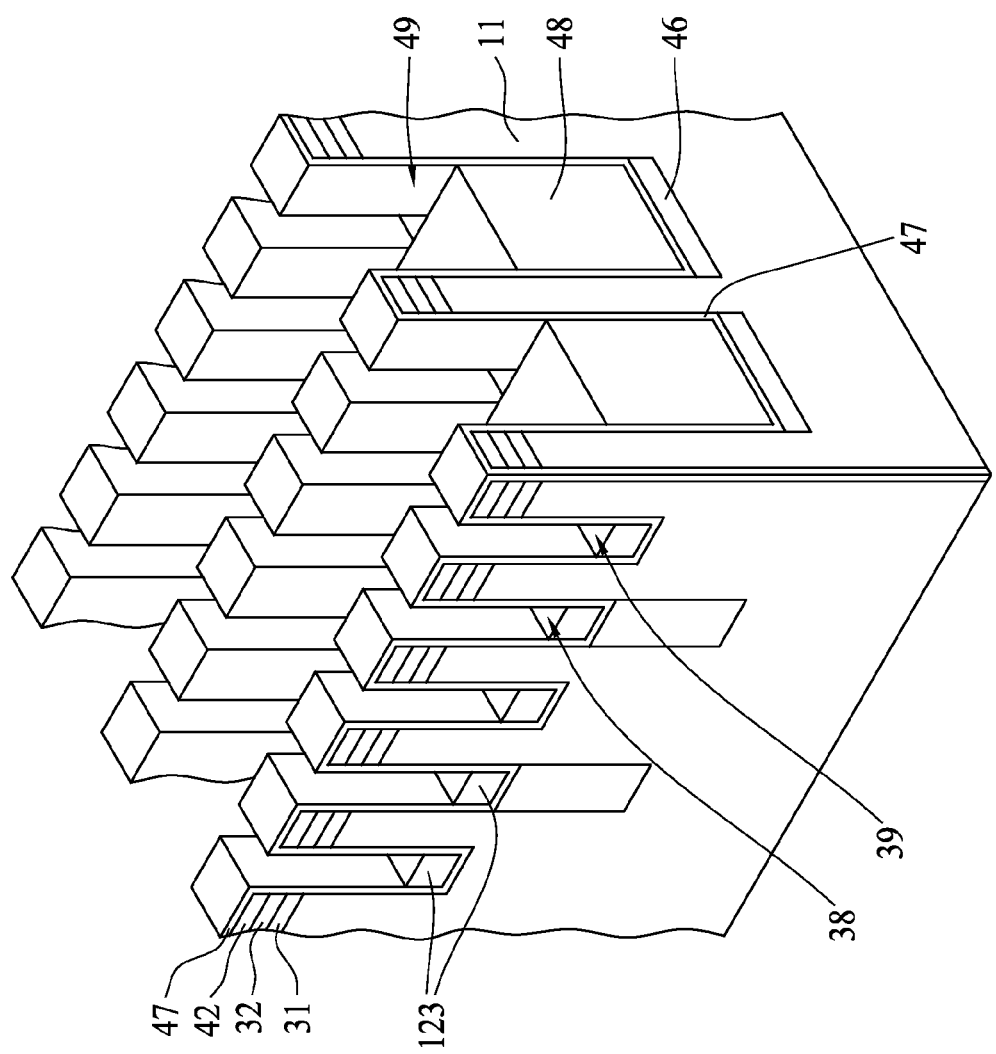

Referring to FIG. 11, an oxidation process is employed to form a thin oxide layer 47 on the substrate 30. After that, a conductive material 48 such as titanium nitride is deposited to a level above the substrate 30. Thereafter, an etch back process is performed to partially remove the deposited conductive material 48 to form depressions 49 as shown in FIG. 12. In the mean time, a plurality of interconnecting portions 123 are formed in the respective shallow trenches 39 and deep trenches 39. Afterwards, a dielectric material 50 is deposited to fill the depressions 49, the shallow trenches 39 and the deep trenches 39. A CMP process is then performed to partially remove the dielectric material 50 and stopped at the silicon nitride layer 42.

Figure 13:
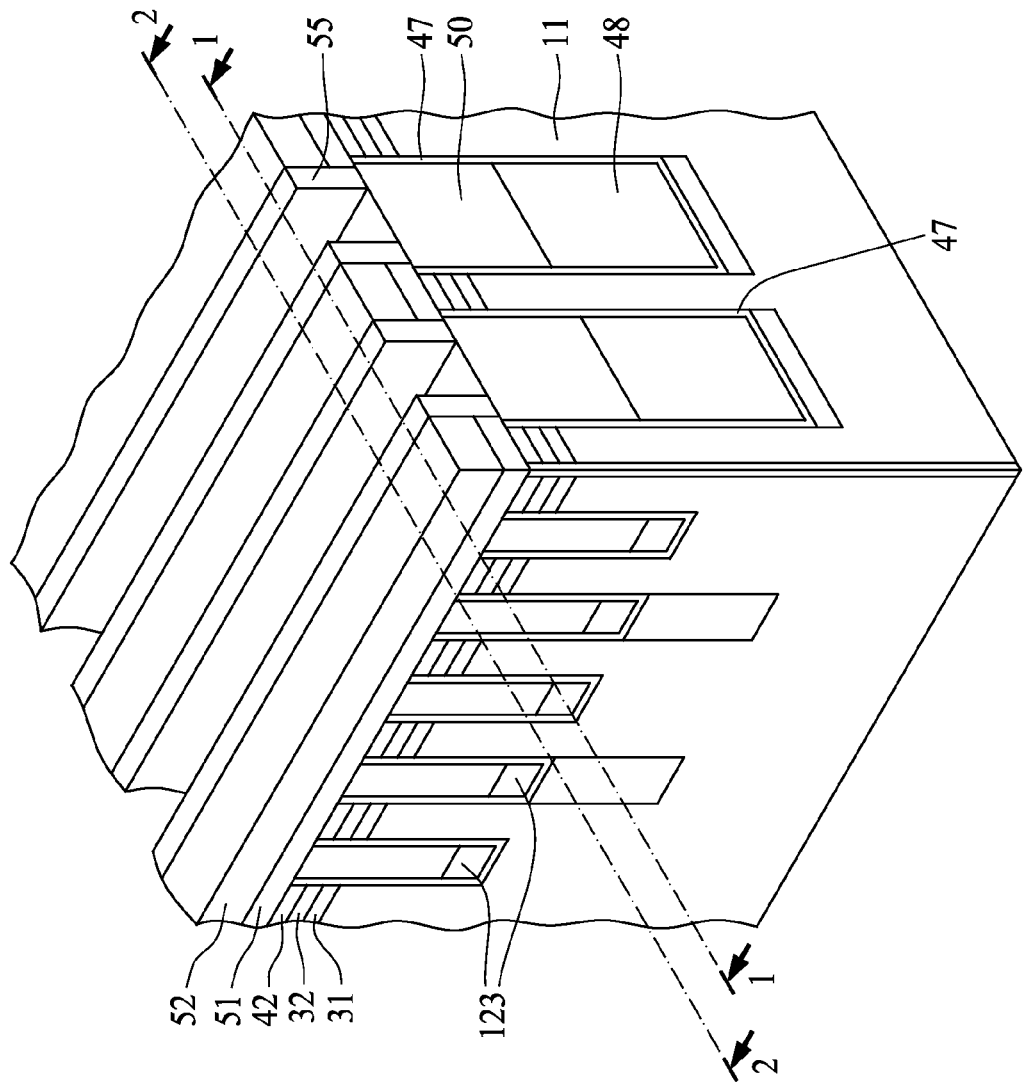
Figure 14:
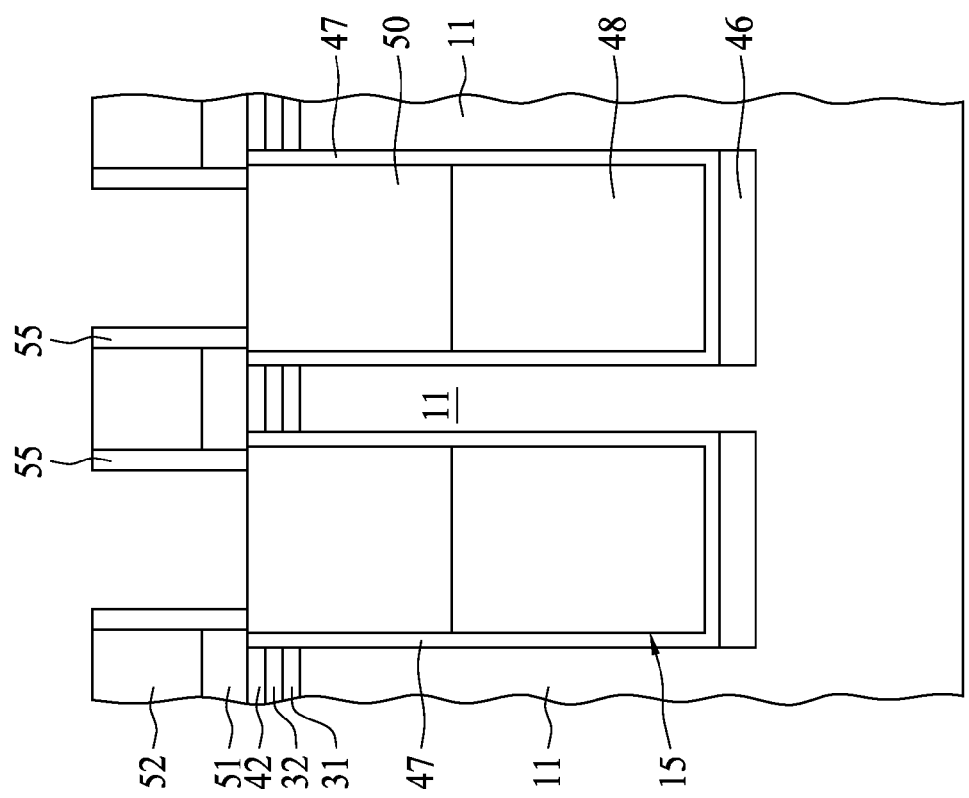
Figure 15:
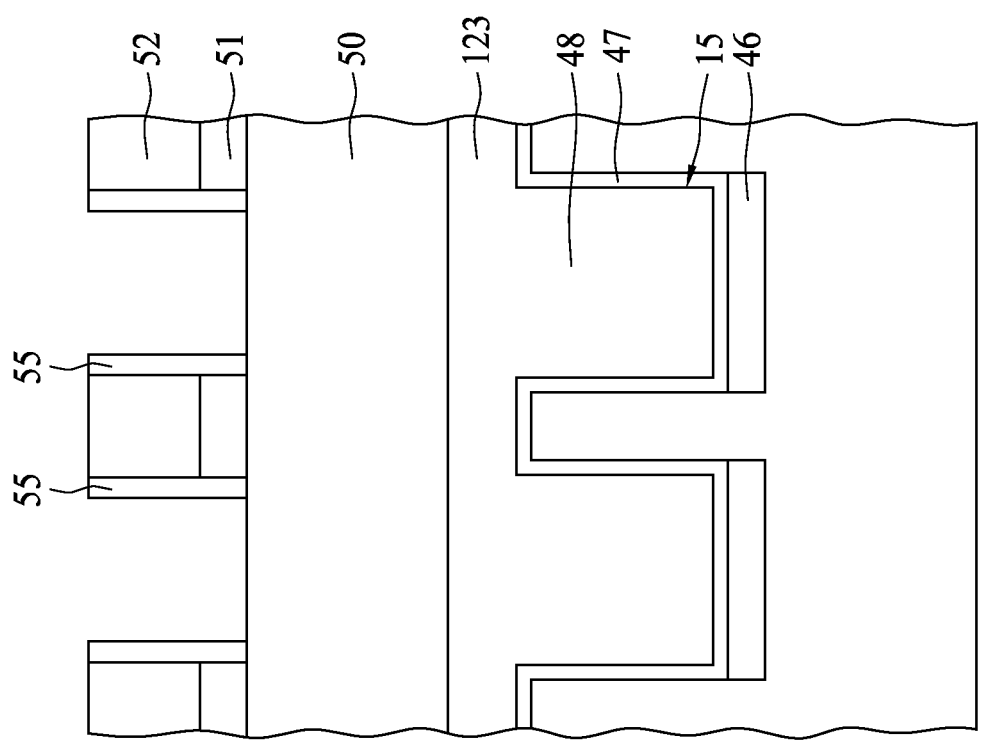

Referring to FIGS. 13 to 15, wherein FIG. 14 is a cross-sectional view along the section line 1-1 in FIG. 13, and FIG. 15 is a cross-sectional view along the section line 2-2 in FIG. 13. A hard mask layer 51 including a plurality of lines is formed by using a photoresist layer 52 including a plurality of lines extending parallel to the extension direction of depressions 15. Each line of the hard mask layer 51 is above a corresponding mesa structure 11 as shown in FIGS. 14 and 15. Spacers 55 are formed on the sidewalls of the lines of the hard mask layer 51 and the photoresist layer 52, wherein two opposite facing spacers 55 are separated by a distance of approximately equal to the photolithographic minimum feature width F. Each space of two opposite facing spacers 55 expose a portion of the dielectric material 50.

Figure 16:
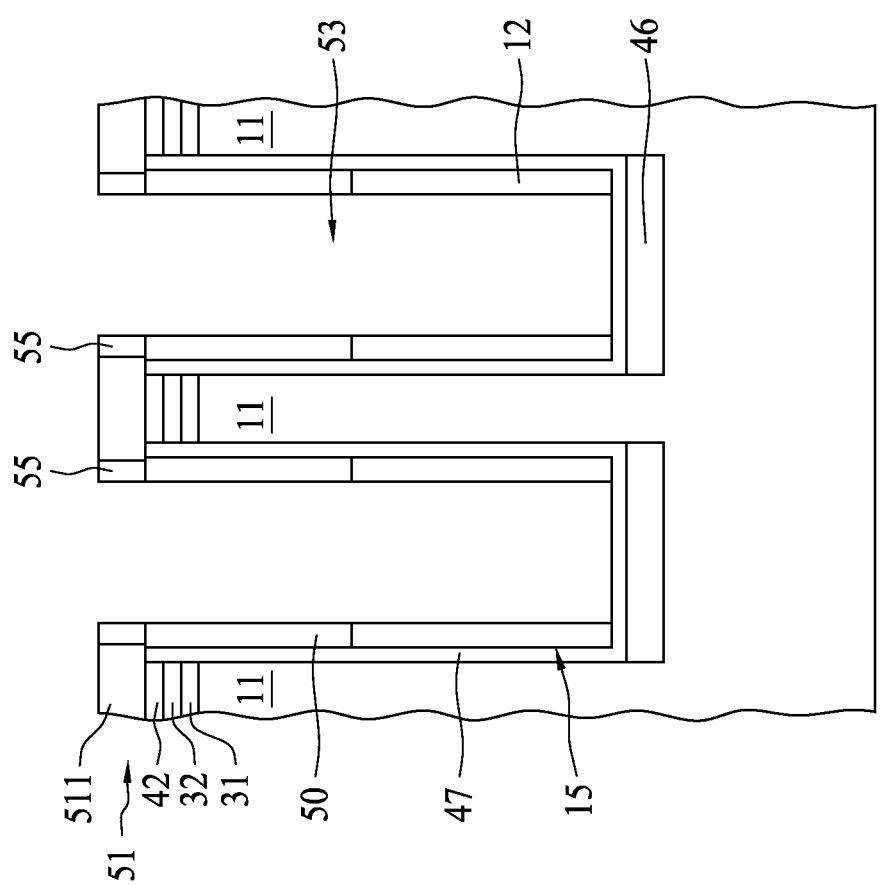
Figure 17:
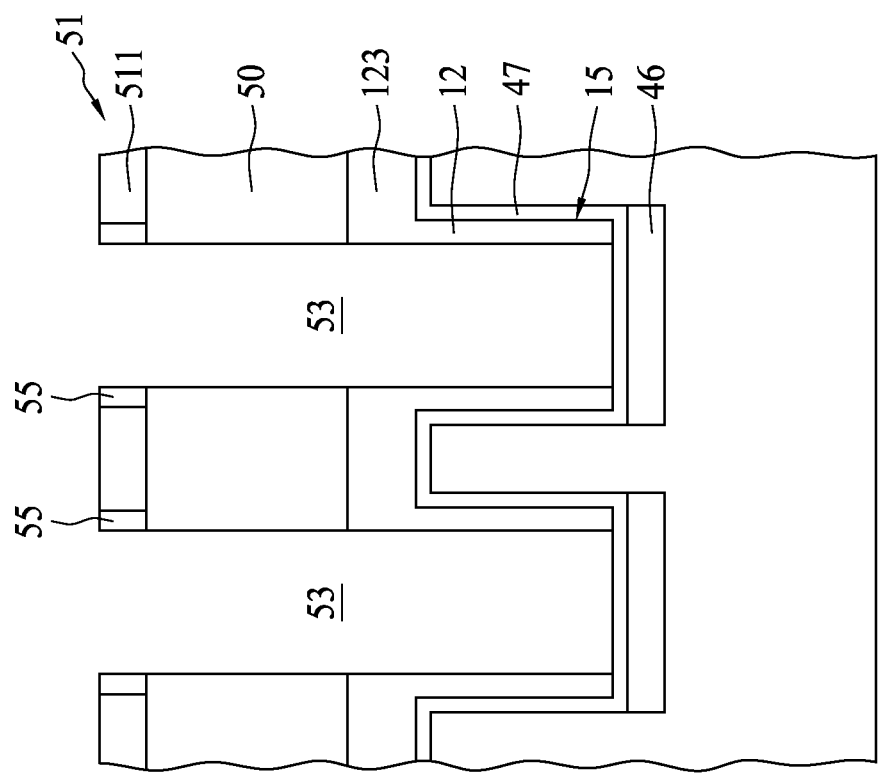

Referring to FIGS. 16 and 17, wherein FIG. 16 is a cross-sectional view showing a process step subsequent to that of FIGS. 14 and 15, viewed along the section line 1-1 in FIG. 13, and FIG. 17 is a cross-sectional view showing a process step subsequent to that of FIGS. 14 and 15, viewed along the section line 2-2 in FIG. 13. Using the hard mask layer 51, a portion of the dielectric material 50 and the conductive material 48 between the mesa structures 11 is removed to form a plurality of trenches 53 so that a plurality of word lines 12 are formed on the side surface of the mesa structures 11. It can be seen that the vertical length of the cross section of the word line 12 extending in parallel to the sidewall of the mesa structures 11 is greater than the horizontal length of the cross section of the word line 12, and word lines 14 with such a configuration can be more easily isolated from each other in the horizontal direction. In addition, the resistance of the word line 12 can be decreased by widening it vertically, with no significant impact on the size of memory cell.

Figure 18:
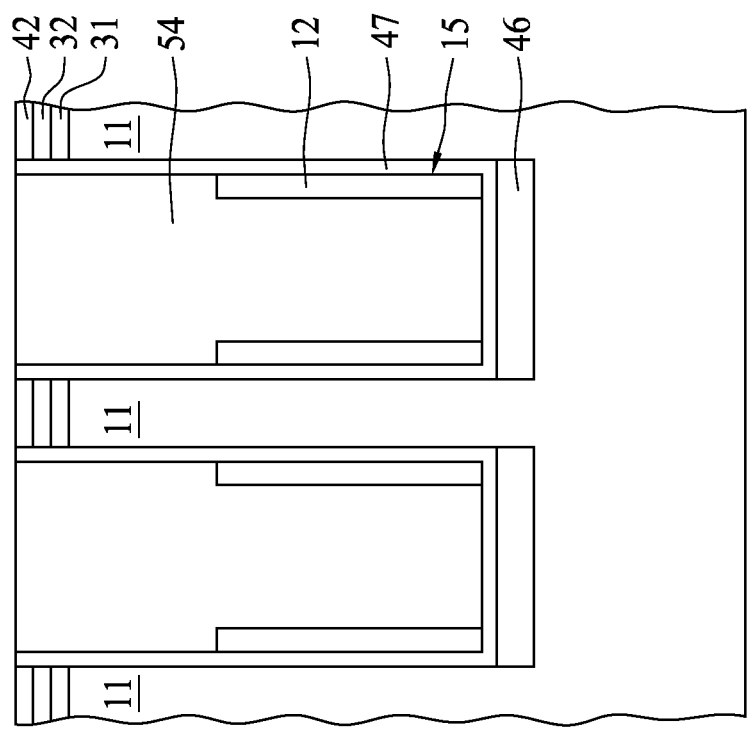
Figure 19:
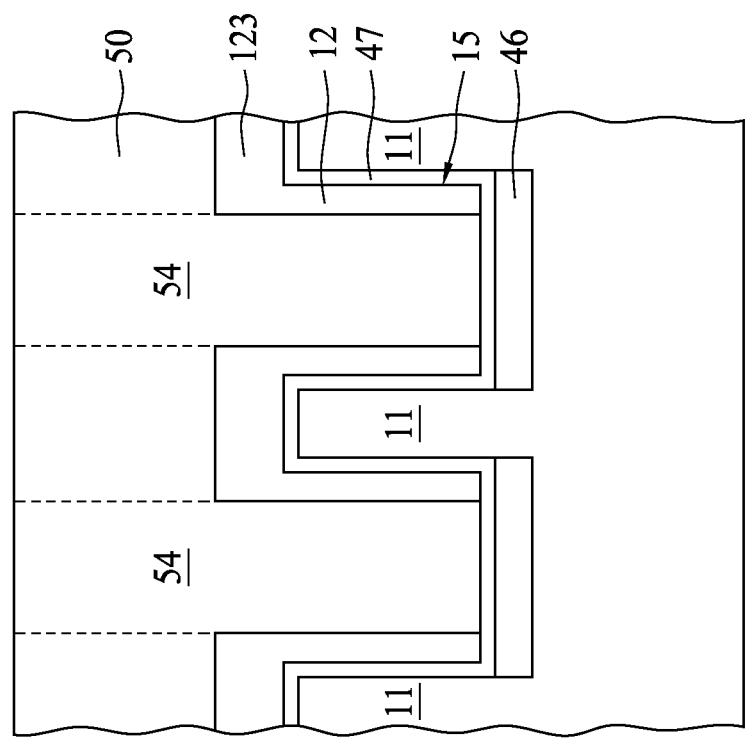

Referring to FIGS. 18 and 19, wherein FIG. 18 is a cross-sectional view showing a process step subsequent to that of FIGS. 16 and 17, viewed along the section line 1-1 in FIG. 13, and FIG. 19 is a cross-sectional view showing a process step subsequent to that of FIGS. 16 and 17, viewed along the section line 2-2 in FIG. 13. The trenches 53 formed in the process shown in FIGS. 16 and 17 are filled with dielectric material 54 such as silicon dioxide, and a CMP process is then carried out and stopped at the silicon nitride layer 42. Thereafter, referring back to FIG. 1, capacitors 14 and bit lines 17 are formed, connecting respective source/drain regions 101. A memory device 1, as shown in FIG. 1, is essentially completed.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a memory device, comprising:
   filling a first dielectric material in a plurality of deep trenches and a plurality of shallow trenches to separately form a plurality of deep isolations and a plurality of shallow isolations in a substrate, wherein each shallow trench is formed between two adjacent ones of the plurality of the deep trenches;
   forming a plurality of depressions transverse to the plurality of deep isolations, wherein two adjacent ones of the plurality of depressions define a mesa structure, and a depression is wider than the mesa structure;
   filling the plurality of depressions with a second dielectric material;
   removing a portion of the first dielectric material from the plurality of shallow trenches and the plurality of deep trenches and a portion of the second dielectric material from the plurality of depressions;
   forming a conductive layer in the plurality of shallow trenches, the plurality of deep trenches and the plurality of depressions; and
   removing a portion of the conductive layer in the depression to form two word lines.

2. The method of claim 1, wherein the forming of the plurality of deep isolations in the substrate comprising:
- forming a mask on the substrate, wherein the mask includes a plurality of lines, each having a width, spaced apart by a distance equal to the width;
- forming first sidewall spacers on sidewalls of the lines of the mask, wherein the sidewall spacers facing each other are spaced by a distance equal to one half of the width of the lines; and
- etching and filling the substrate between the first sidewall spacers to form the plurality of deep isolations in the substrate.

3. The method of claim 2, wherein the forming of the plurality of shallow isolations comprising:
- removing the mask;
- forming second sidewall spacers from the first sidewall spacers, wherein the second sidewall spacers facing each other are spaced by a distance equal to one half of the width of the line of the mask; and
- etching and filling the substrate between the second sidewall spacers to form the plurality of shallow isolations in the substrate.

4. The method of claim 1, wherein a ratio of the width of the depression to the width of the mesa structure is approximately 3:1.

5. The method of claim 1, wherein the width of the deep isolation is one half of the minimum lithographic feature size.

6. The method of claim 1, wherein the width of the shallow isolation is one half of the minimum lithographic feature size.

7. The method of claim 1, wherein the deep isolation and the shallow isolation are spaced apart by a distance of one half of the minimum lithographic feature size.

\* \* \* \* \*